(12) United States Patent
Setsompop et al.

(10) Patent No.: US 10,871,534 B2
(45) Date of Patent: Dec. 22, 2020

(54) ACCELERATED MAGNETIC RESONANCE IMAGING USING A TILTED RECONSTRUCTION KERNEL IN PHASE ENCODED AND POINT SPREAD FUNCTION ENCODED K-SPACE

(71) Applicant: The General Hospital Corporation, Boston, MA (US)

(72) Inventors: Kawin Setsompop, Charlestown, MA (US); Lawrence L. Wald, Cambridge, MA (US); Zijing Dong, Beijing (CN); Hua Guo, Beijing (CN); Fuyixue Wang, Cambridge, MA (US); Timothy G. Reese, Bedford, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 16/429,467

(22) Filed: Jun. 3, 2019

(65) Prior Publication Data

US 2019/0369186 A1    Dec. 5, 2019

Related U.S. Application Data

(60) Provisional application No. 62/679,236, filed on Jun. 1, 2018.

(51) Int. Cl.
  *G01R 33/48*    (2006.01)
  *G01R 33/561*    (2006.01)
  *G01R 33/50*    (2006.01)
  *G01R 33/565*    (2006.01)

(52) U.S. Cl.
  CPC ......... *G01R 33/4818* (2013.01); *G01R 33/50* (2013.01); *G01R 33/565* (2013.01); *G01R 33/5619* (2013.01)

(58) Field of Classification Search
  CPC   G01R 33/4818; G01R 33/5619; G01R 33/50; G01R 33/565; G01R 33/5611; G01R 33/5616
  See application file for complete search history.

(56) References Cited

U.S. PATENT DOCUMENTS

| | | | |
|---|---|---|---|
| 2005/0174113 A1* | 8/2005 | Tsao | G01R 33/5611 324/307 |
| 2019/0369199 A1* | 12/2019 | Setsompop | G01R 33/5616 |

* cited by examiner

*Primary Examiner* — Susan S Lee
(74) *Attorney, Agent, or Firm* — Quarles & Brady LLP

(57) ABSTRACT

Systems and methods for accelerated magnetic resonance imaging using a tilted reconstruction kernel to synthesize unsampled k-space data in phase encoded and point spread function ("PSF") encoded k-space data are provided. Images reconstructed from the data have reduced $B_0$-related distortions and reduced $T_2^*$ blurring. In general, data are acquired with systematically optimized undersampling of the PSF and phase encoding subspace. Parallel imaging reconstruction is implemented with a $B_0$ inhomogeneity informed approach to achieve greater than twenty-fold acceleration of the PSF encoding dimension. A tilted reconstruction kernel is used to exploit the correlations in the phase encoding-PSF encoding subspace.

15 Claims, 5 Drawing Sheets

ACCELERATED MAGNETIC RESONANCE IMAGING USING A TILTED RECONSTRUCTION KERNEL IN PHASE ENCODED AND POINT SPREAD FUNCTION ENCODED K-SPACE

CROSS-REFERENCE TO RELATED APPLICATIONS

This application claims the benefit of U.S. Provisional Patent Application Ser. No. 62/679,236, filed on Jun. 1, 2018, and entitled "ACCELERATED MAGNETIC RESONANCE IMAGING USING A TILTED RECONSTRUCTION KERNEL IN PHASE ENCODED AND POINT SPREAD FUNCTION ENCODED K-SPACE," which is herein incorporated by reference in its entirety.

STATEMENT REGARDING FEDERALLY SPONSORED RESEARCH

This invention was made with government support under EB020613, EB019437, and EB015896, awarded by the National Institutes of Health. The government has certain rights in the invention.

BACKGROUND

One of the main challenges in high-resolution EPI is the significant $B_0$-distortion and $T_2^*$-blurring artifacts. Point Spread Function ("PSF") mapping encodes an additional phase-encoding ($k_{psf}$) into an echo planar imaging ("EPI") acquisition to provide a highly reliable mapping of $B_0$-distortion and $T_2^*$-blurring. Due to its encoding-intensive nature, which requires greater than 100 EPI-shots, PSF-EPI is typically performed as a pre-scan to estimate a distortion map used for post-processing correction of subsequent EPI scans. Such correction nicely removes $B_0$-distortions, but does not remove $T_2^*$-blurring, and also leads to significant loss in resolution and anatomical details in areas with strong magnetic susceptibility.

Methods have been proposed to accelerate PSF encoding by 5-8 fold through a combination of reduced field-of-view along the PSF encoding axis (e.g., $k_{PSF}$) and parallel imaging along the phase encoding axis (e.g., $k_{PE}$), or along both the phase encoding and PSF encoding axes. This method has permitted PSF-EPI to be used for imaging directly, and is capable of achieving high-quality diffusion imaging at 7 T. Nonetheless, even with such accelerations, 30-40 EPI shots are still needed to acquire a single brain imaging slice at 1 mm resolution.

SUMMARY OF THE DISCLOSURE

The present disclosure addresses the aforementioned drawbacks by providing a method for reconstructing an image of a subject from data acquired with a magnetic resonance imaging ("MRI") system. First data are acquired with an MRI system. The first data include k-space data encoded along at least a phase encoding dimension and a point spread function ("PSF") encoding dimension. The first data are undersampled along at least one of the phase encoding dimension or the PSF encoding dimension. Second data are generated with a computer system by synthesizing unsampled k-space points in at least one of the phase encoding dimension or the PSF encoding dimension by applying a tilted reconstruction kernel to the first data. The tilted reconstruction kernel spans the phase encoding dimension and the PSF encoding dimension. An image is reconstructed from the second data, wherein the image has reduced distortions and $T_2$ blurring relative to images reconstructed from the first data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for accelerated point spread function ("PSF") mapping with magnetic resonance imaging ("MRI"), such that images can be reconstructed with reduced distortions induced by $B_0$ inhomogeneities and reduced $T_2^*$ blurring. In general, data are acquired with systematically optimized undersampling of the PSF and phase encoding subspace (e.g., $k_{PSF}$–$k_{PE}$ subspace). Parallel imaging reconstruction is implemented with a $B_0$-inhomogeneity informed approach to achieve greater than twenty-fold acceleration of the PSF encoding dimension. A tilted reconstruction kernel is used to exploit the correlations in the $k_{PSF}$–$k_{PE}$ subspace. Because the systems and methods described in the present disclosure implement a tilted kernel, they may be generally referred to as "tilted-CAIPI" or "tilted-CAIPIRINHA."

As one example, the systems and methods described in the present disclosure have been demonstrated for fast, distortion-free and blurring-free imaging at 1 mm resolution range with 4-8 shots, thereby enabling whole-brain imaging in 20-30 s. The systems and methods described in the present disclosure can therefore improve the functioning of the MRI scanner by enabling whole-brain imaging exams to be shortened from 20-30 minutes to just 1-2 minutes.

Figure 1:
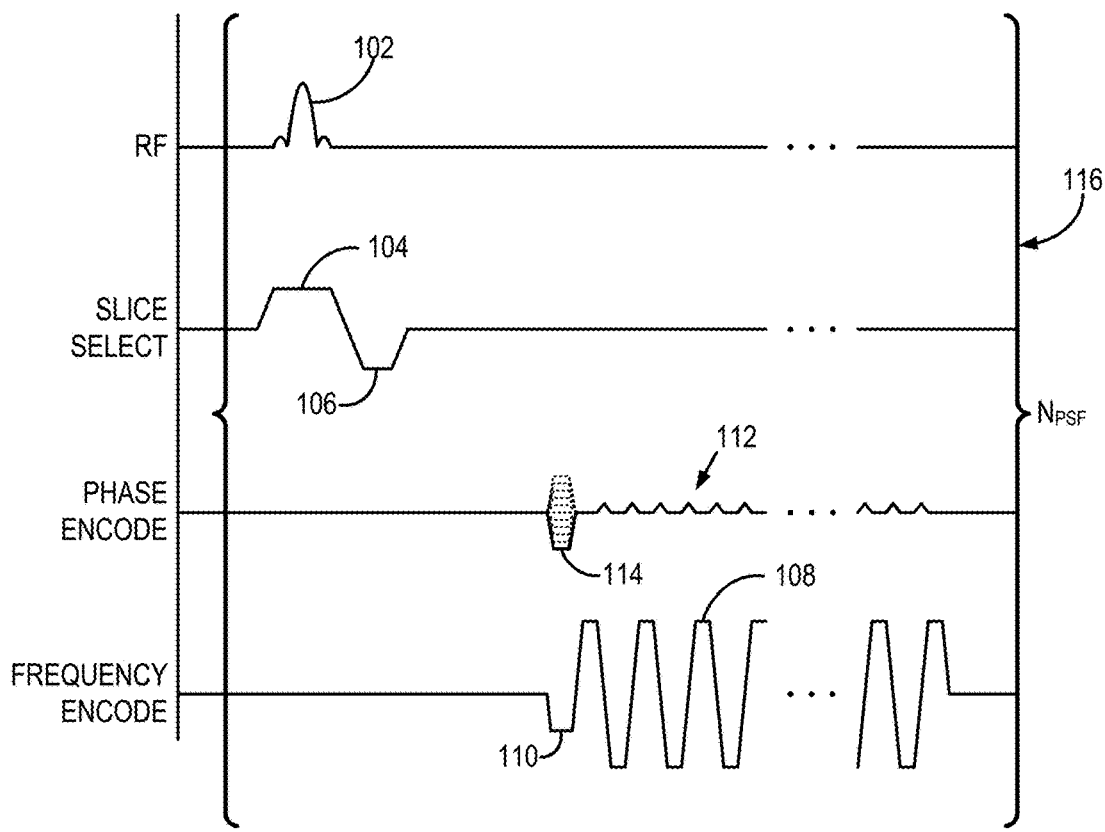
FIG. 1 is an example of a point spread function ("PSF") echo planar imaging ("EPI") pulse sequence that can be implemented in some embodiments of the present disclosure.

Referring now to FIG. 1, an example of a PSF-EPI pulse sequence is shown. In this example, data are acquired by forming and sampling gradient echoes; however, data can also be acquired using a spin-echo EPI sequence. The pulse sequence includes a radio frequency ("RF") excitation pulse 102 that is played out in the presence of a slice-select gradient 104 in order to produce transverse magnetization in a prescribed imaging slice. The slice-select gradient 104 includes a rephasing lobe 106 that acts to rephase unwanted phase dispersions introduced by the slice-select gradient 104, such that signal losses resultant from these phase dispersions are mitigated.

Following excitation of the nuclear spins in the prescribed imaging slice, data are acquired by sampling a series of gradient echo signals in the presence of an alternating readout gradient 108. The alternating readout gradient is preceded by the application of a pre-winding gradient 110 that acts to move the first sampling point along the frequency-encoding, or readout, direction by a prescribed distance in k-space. Spatial encoding of the echo signals along a phase-encoding direction is performed by a series of phase encoding gradient "blips" 112, which are each played out in between the successive signal readouts such that each echo signal is separately phase-encoded. The phase-encoding gradient blips 112 are preceded by the application of a pre-winding gradient 114 that acts to move the first sampling point along the phase-encoding direction by a prescribed distance in k-space. Here, the pre-winding gradient 114 is implemented using a gradient table, in which the pulse sequence is repeated $N_{PSF}$ different times for $N_{PSF}$ different values for the pre-winding gradient 114. The bracket 116 thus represents the PSF-encoding loop that sample a point, $k_{PSF}$, on the PSF-encoding axis at a plurality of different points, $k_{PE}$, on the phase-encoding axis. Because the phase-encoding gradient blips 112 and pre-winding gradients 114 are played out on the same gradient axis, both the PSF-encoding axis and the phase-encoding axis will lie on the same direction in k-space (e.g., $k_y$), but represent different encodings of data.

As is known in the art, the foregoing pulse sequence can be repeated a plurality of times while applying a different slice-select gradient 104 during each repetition such that a plurality of slice locations are sampled. In some other implementations, a simultaneous multislice excitation and acquisition scheme can also be implemented. As one example, the blipped-CAIPIRINHA acquisition described in U.S. Pat. No. 8,405,395, which is herein incorporated by reference in its entirety, can be implemented.

Using a PSF-EPI pulse sequence, data are acquired as a 3D k-space data set ($k_x$, $k_y$, $k_{PSF}$) for each slice, where $k_y$ (e.g., $k_{PE}$) and $k_{PSF}$ both implement gradient-encoding along the y-direction. As noted above, each EPI-shot (e.g., each repetition of the bracket 116) uses the pre-winding gradient 114 blip to achieve a particular $k_{PSF}$ encoding step. At a certain $k_{PE}$ point, all the PSF-encoding signals are acquired at the same echo time; therefore, there is no distortion and T blurring along the PSF direction.

In conventional accelerated PSF-EPI, the $k_{PE}-k_{PSF}$ encodings are undersampled by $R_{PE} \times R_{PSF}$ and recovered using sequential PE-GRAPPA and PSF-GRAPPA reconstructions. Here, $R_{PE}$ is used to reduce effective echo spacing ("ESP") and thereby the level of distortion, blurring, or both, which enables higher $R_{PSF}$ accelerations (i.e., less EPI-shots).

To achieve higher acceleration for PSF-EPI, the systems and methods described in the present disclosure exploit the inherent correlation of PE-PSF encoding through optimized sub-sampling and reconstruction. As described above, in PSF-EPI, $k_{PSF}$ encoding utilizes a pre-winding gradient 114 to shift the effective phase-encoding of each EPI-shot. As a result, data points along a diagonal line (e.g., a −45 degree line) in the $k_{PE}-k_{PSF}$ plane share the same effective y-gradient encoding, with additional encodings from $B_0$-inhomogeneity induced phase and $T_2/T_2^*$ signal decay. The orientation (e.g., angle, direction) of this diagonal line can be influenced by the choice of the pre-winding gradient 114 (e.g., its magnitude, polarity, or both). Because the time differences are very small among neighboring points along this diagonal line (e.g., a few milliseconds), a tilted compact kernel operator in $k_{PE}-k_{PSF}$ across multi-coil data can be used to effectively capture the small $B_0$-inhomogeneity induced phase, and to interpolate small $T_2^*$ decay, in order to recover undersampled data along $k_{PE}-k_{PSF}$.

Figure 2A:
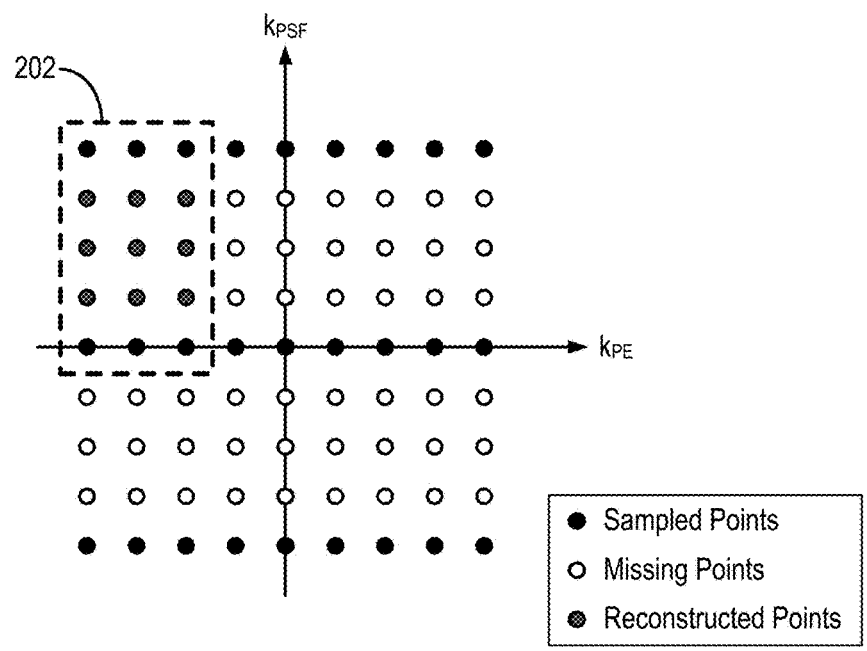
FIG. 2A is an example of a phase encoded and PSF encoded subspace of k-space, in which a rectangular reconstruction kernel is used to synthesize unsampled k-space points.

FIG. 2A shows an example of a $k_{PE}-k_{PSF}$ sampling used in conventional PSF-EPI. In these methods, a square kernel 202 is used to reconstruct the missing signals along the PSF-encoding dimension after undersampling of the phase-encoding data, $k_{PE}$, has been recovered using PE-GRAPPA.

Figure 2B:
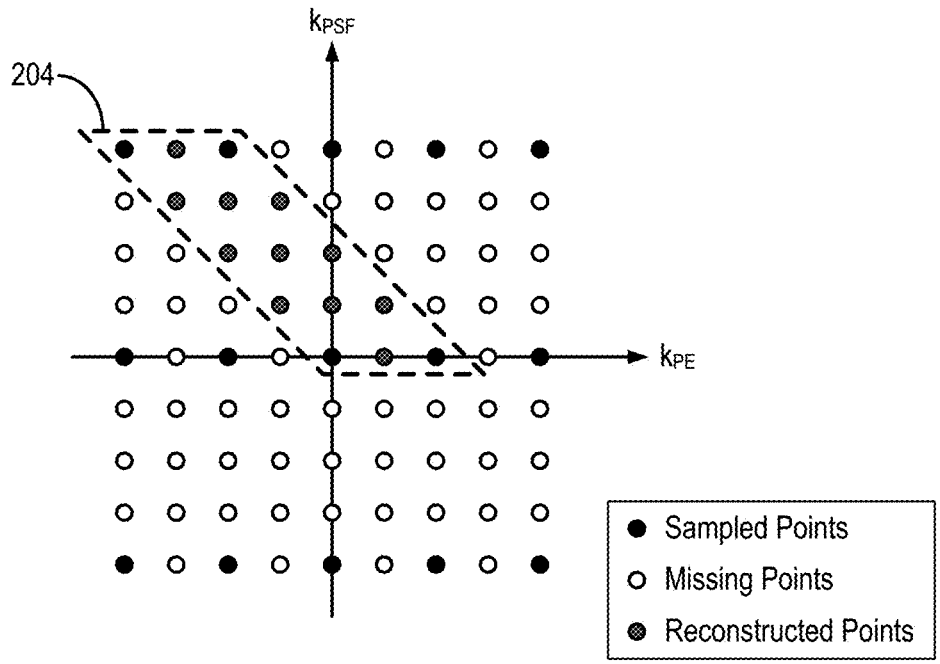
FIG. 2B is an example of a phase encoded and PSF encoded subspace of k-space, in which a tilted reconstruction kernel is used to synthesize unsampled k-space points.

FIG. 2B shows an example of a $k_{PE}-k_{PSF}$ sampling used in some embodiments of the systems and methods described in the present disclosure. As shown, additional acceleration can be provide along the $k_{PE}$ dimension. A tilted kernel 204 is then used to take advantage of the strong correlation of the PE-PSF dimension through a joint PE-PSF reconstruction, rather than a sequential reconstruction as is done in conventional PSF-EPI techniques.

In general, the tilted kernel 204 is oriented at −45 degrees in the $k_{PE}-k_{PSF}$ plane; however, in other implementations the tilted kernel could also be oriented at +45 degrees in the $k_{PE}-k_{PSF}$ plane, or at other angles. The tilted kernel 204 spans one or more points in the $k_{PE}$ dimension and one or more points in the $k_{PSF}$ dimension. In the example shown in FIG. 2B, the tilted kernel 204 spans three points in the $k_{PE}$ dimension and five points in the $k_{PSF}$ dimension.

Figure 2C:
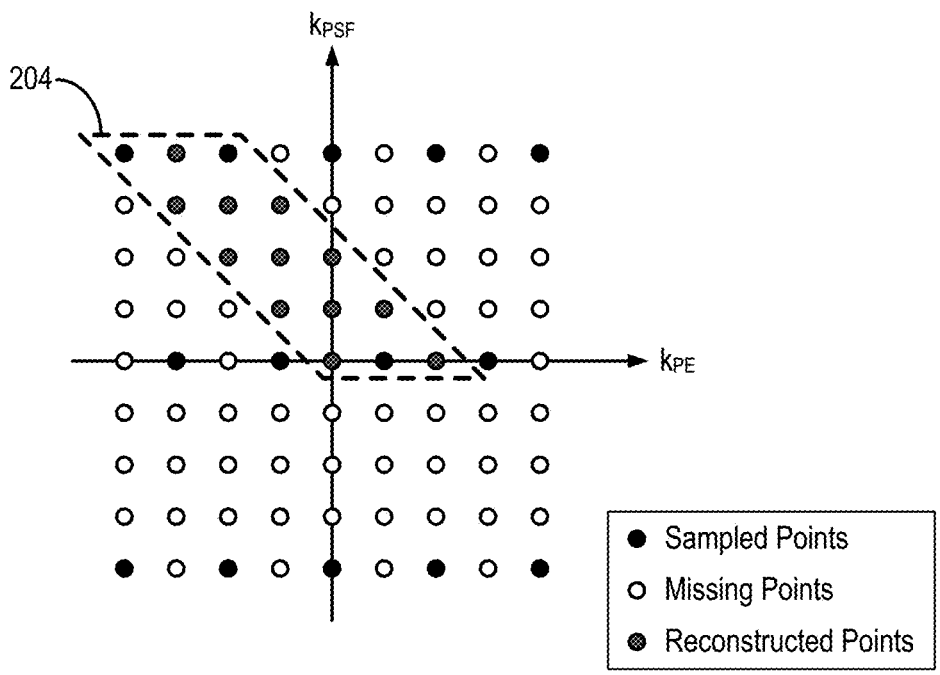
FIG. 2C is an example of a phase encoded and PSF encoded subspace of k-space, in which a tilted reconstruction kernel is used to synthesize unsampled k-space points and in which alternating phase encoding lines are shifted relative to each other.

FIG. 2C shows an example of a $k_{PE}-k_{PSF}$ sampling used in some other embodiments of the systems and methods described in the present disclosure. In this example, the sampling along the $k_{PE}$ dimension is shifted to achieve an optimized sampling pattern for parallel imaging. For instance, a 2D-CAIPIRINHA shift can be used.

To further reduce acquisition time, the tilted-CAIPI techniques described in the present disclosure can be combined with simultaneous multislice ("SMS") imaging techniques, such as blipped-CAIPI; partial Fourier acquisition, where partial Fourier along PSF and PE are recovered using a reconstruction such as a 3D POCS reconstruction; or both.

Figure 2D:
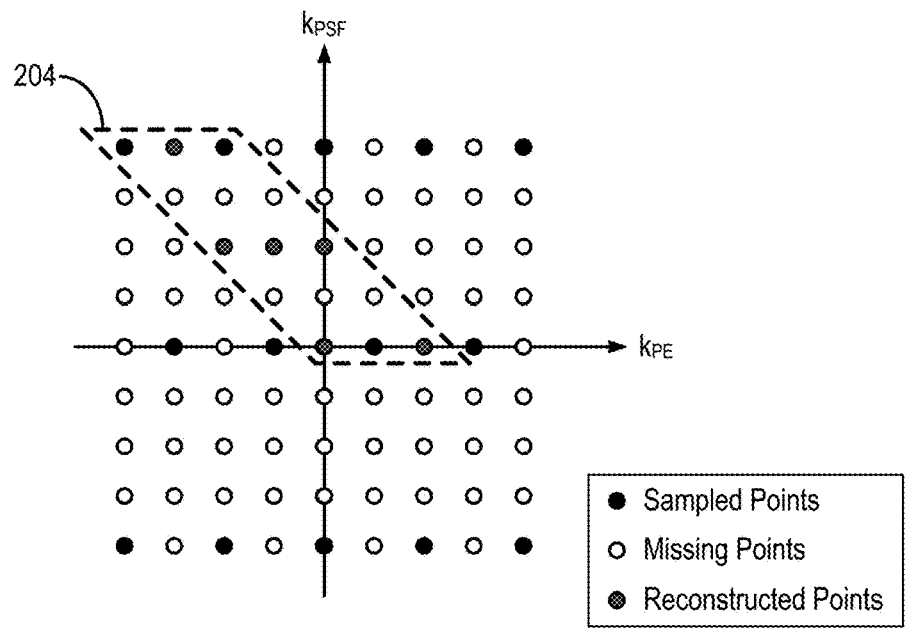
FIG. 2D is an example of phase encoded and PSF encoded calibration data.

For kernel training, low-resolution fully-sampled PSF-EPI data can be acquired with matching effective ESP. This calibration scan time can be reduced using SMS techniques; reduced field-of-view ("FOV") reconstruction, which reduces the number of kernels to be trained; or both. As noted, and as shown in FIG. 2D, the calibration scan can be accelerated by only reconstructing a part of k-space using GRAPPA, or another suitable reconstruction method, on the PSF encodings (i.e., PSF-GRAPPA). In these instances, the remaining aliasing in y-PSF can be unfolded in the image domain. As one example, this unfolding can be achieved using a reduced field-of-view ("FOV") technique, such as by applying an rFOV technique to the PSF encoding. $rFOV_{PSF}$.

Figure 3:
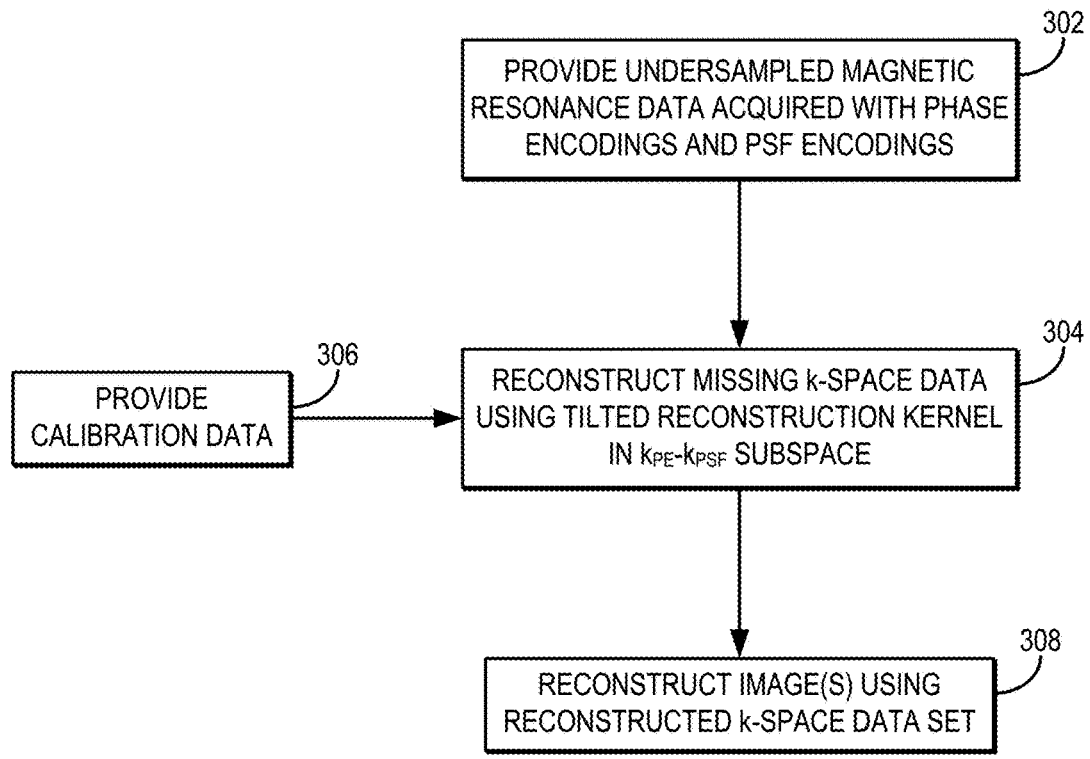
FIG. 3 is a flowchart setting forth the steps of an example method for acquiring data and reconstructing an image according to embodiments of the present disclosure.

Referring now to FIG. 3, a flowchart is illustrated as setting forth the steps of an example method for reconstructing an image of a subject using a tilted-CAIPI technique, such as those described above. The method includes providing magnetic resonance data to a computer system, as indicated at step 302. The magnetic resonance data may be provided to the computer system by retrieving previously acquired data from a memory or other data storage. The magnetic resonance data may also be provided to the computer system by acquiring such data with an MRI system that then communicates the magnetic resonance data to the computer system. In some instances, the computer system may form a part of the MRI system.

In any instance, the magnetic resonance data are under-sampled data that are acquired using a pulse sequence that provides both phase encoding and PSF encoding. In general, this encoding can be provided by acquiring multiple phase encodings in each of a plurality of different PSF encodings through the application of gradients along the same direction. In the examples described above, phase encoding and PSF encoding are provided through the application of gradients along the y-direction; however, it will be appreciated that phase encoding and PSF encoding can also be provided along other directions (e.g., the x-direction or the z-direction) based on slice orientation or user preference.

As an example, the magnetic resonance data can be acquired using a PSF-EPI pulse sequence that samples k-space along a plurality of phase encoding steps while looping over a plurality of different PSF encoding steps. As a result, data are acquired as 3D data (e.g., $(k_x, k_y, k_{PSF})$ data) for each slice. As mentioned above, the phase encoding lines can be shifted using techniques such as 2D-CAIPIR-INHA.

The magnetic resonance data are then processed to jointly reconstruct missing k-space data in the phase encodings and PSF encodings (i.e., in the $k_{PE}$–$k_{PSF}$ subspace), as indicated at step 304. As noted above, this reconstruction implements a tilted kernel that exploits the correlation between data acquired in the $k_{PE}$–$k_{PSF}$ subspace. The missing k-space data can be reconstructed using a GRAPPA, or other suitable, algorithm that has been adapted to jointly reconstruct k-space data points in both the $k_{PE}$ and $k_{PSF}$ dimensions.

Calibration data are preferably provided to the computer system to aid in the reconstruction of missing k-space data, as indicated at step 306. Calibration data can be acquired in a separate calibration scan. The calibration data can also be acquired using an accelerated acquisition, in which case additional calibration data can be synthesized using a tilted reconstruction kernel as described in the present disclosure. A single calibration dataset can be used to reconstruct multiple data sets. By acquiring low-resolution calibration scan data at shorter echo times, whole-brain calibration scan times can be reduced to less than 20 s.

One or more images are then reconstructed from the resulting k-space data, as indicated at step 308, using a suitable image reconstruction algorithm. In some instances, a low-rank based image reconstruction algorithm can be implemented to further improve acceleration performance, reconstruction performance, or both. As noted above, the resulting images will have reduced or otherwise removed $B_0$ distortions and $T_2^*$ blurring.

The tilted-CAIPI methods described in the present disclosure achieve dramatic acceleration for PSF-EPI by exploiting the inherent correlation in $k_{PE}$–$k_{PSF}$ with optimized under-sampling and $B_0$-inhomogeneity-informed reconstruction. The ability of tilted-CAIPI to achieve fast distortion-free and blurring-free imaging with high SNR was demonstrated in example implementations in which data were acquired at 3 T for T2-weighted spin-echo (SE) imaging at 1×1×3 mm³ and 0.9×0.9×1 mm³, and for gradient-echo (GE) and spin-echo at 0.8×0.8×3 mm³. Data can be acquired in just 4-8 shots, enabling whole brain $T_2/T_2^*$-weighted imaging in about 20-30 s.

The tilted-CAIPI methods described in the present disclosure improve the acquisition efficiency of current commercial MRI pulse sequences. Tilted-CAIPI enables fast whole-brain MR imaging without distortion and blurring, including $T_2$-weighted, $T_2^*$-weighted, and diffusion-weighted imaging for numerous clinical applications. In particular, this technology has the potential to shorten MRI brain exams by a factor often (e.g., from 20-30 minutes to just 1-2 minutes).

Figure 4:
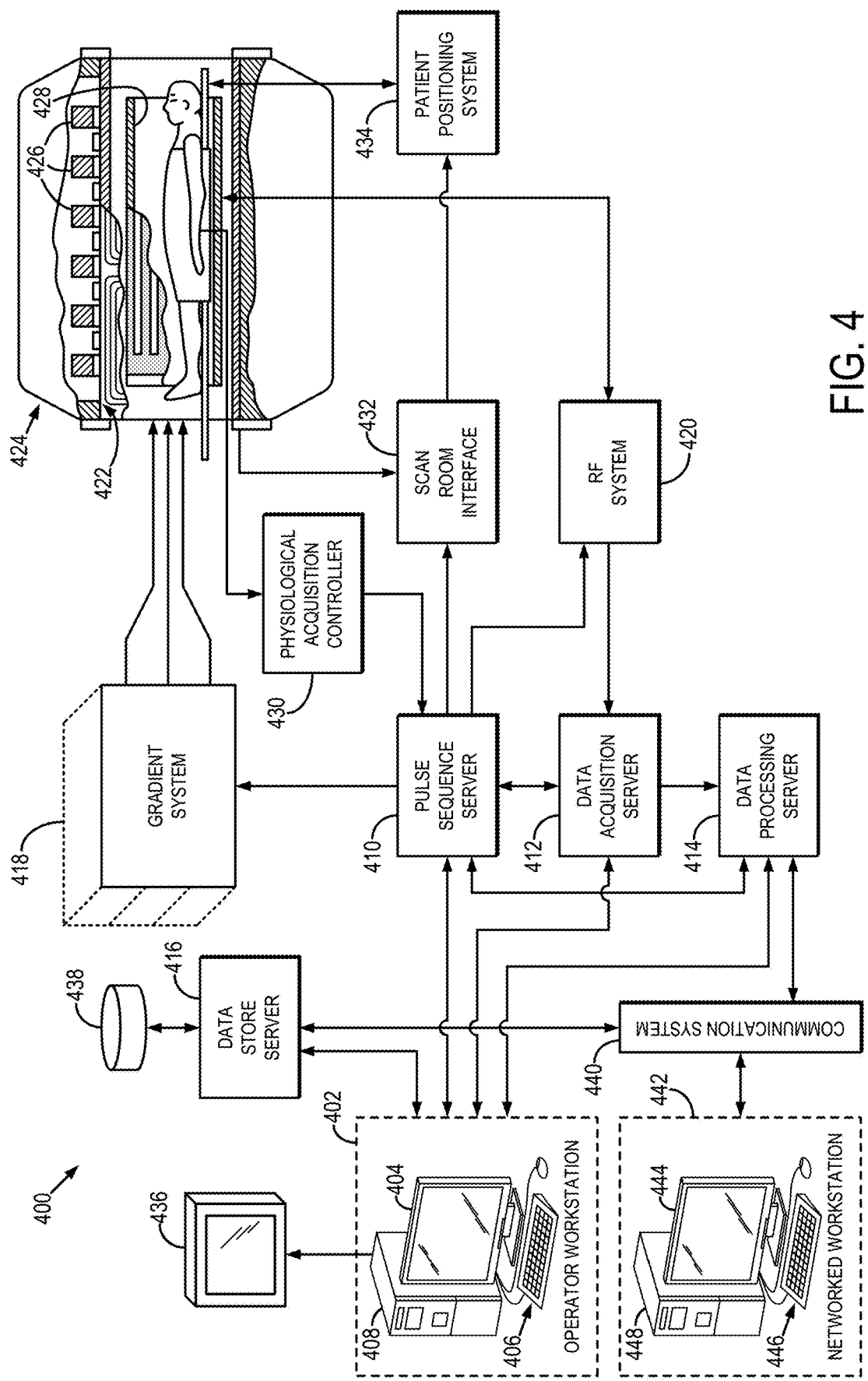
FIG. 4 is a block diagram of an example MRI system that can implement the methods described in the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

Figure 5:
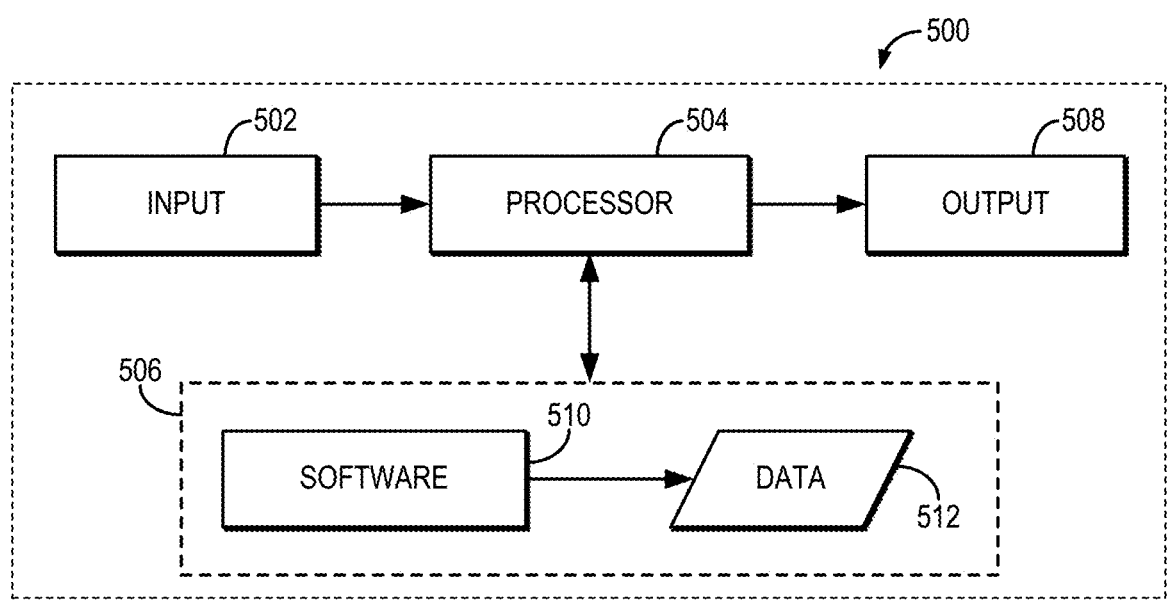
FIG. 5 is a block diagram of an example computer system that can implement the methods described in the present disclosure.

Referring now to FIG. 5, a block diagram of an example of a computer system 500 that can perform the methods described in the present disclosure is shown. The computer system 500 generally includes an input 502, at least one hardware processor 504, a memory 506, and an output 508. Thus, the computer system 500 is generally implemented with a hardware processor 504 and a memory 506.

In some embodiments, the computer system 500 can be a workstation, a notebook computer, a tablet device, a mobile device, a multimedia device, a network server, a mainframe, one or more controllers, one or more microcontrollers, or any other general-purpose or application-specific computing device.

The computer system 500 may operate autonomously or semi-autonomously, or may read executable software instructions from the memory 506 or a computer-readable medium (e.g., a hard drive, a CD-ROM, flash memory), or may receive instructions via the input 502 from a user, or any another source logically connected to a computer or device, such as another networked computer or server. Thus, in some embodiments, the computer system 500 can also include any suitable device for reading computer-readable storage media.

In general, the computer system 500 is programmed or otherwise configured to implement the methods and algorithms described in the present disclosure. For instance, the computer system 500 can be programmed to compute reconstruction kernels, synthesize additional k-space data, and reconstruct images as described.

The input 502 may take any suitable shape or form, as desired, for operation of the computer system 500, including the ability for selecting, entering, or otherwise specifying parameters consistent with performing tasks, processing data, or operating the computer system 500. In some aspects, the input 502 may be configured to receive data, such as data acquired with an MRI system. Such data may be processed as described above to synthesize additional k-space data and reconstruct images. In addition, the input 502 may also be configured to receive any other data or information considered useful for reconstructing images using the methods described above.

Among the processing tasks for operating the computer system 500, the one or more hardware processors 504 may also be configured to carry out any number of post-processing steps on data received by way of the input 502.

The memory 506 may contain software 510 and data 512, such as data acquired with an MRI system, and may be configured for storage and retrieval of processed information, instructions, and data to be processed by the one or more hardware processors 504. In some aspects, the software 510 may contain instructions directed to estimating reconstruction kernels, synthesizing additional k-space data, and reconstructing images as described.

In addition, the output 508 may take any shape or form, as desired, and may be configured for displaying reconstructed images, in addition to other desired information.

The present disclosure has described one or more preferred embodiments, and it should be appreciated that many equivalents, alternatives, variations, and modifications, aside from those expressly stated, are possible and within the scope of the invention.

The invention claimed is:

1. A method for reconstructing an image of a subject from data acquired with a magnetic resonance imaging (MRI) system, the steps of the method comprising:
   (a) acquiring first data with a magnetic resonance imaging (MRI) system, wherein the first data comprise k-space data encoded along at least a phase encoding dimension and a point spread function (PSF) encoding dimension and wherein the first data are undersampled along at least one of the phase encoding dimension or the PSF encoding dimension;
   (b) generating second data with a computer system by synthesizing unsampled k-space points in at least one of the phase encoding dimension or the PSF encoding dimension by applying a tilted reconstruction kernel to the first data, wherein the tilted reconstruction kernel spans the phase encoding dimension and the PSF encoding dimension;
   (c) reconstructing an image from the second data.

2. The method as recited in claim 1, wherein the tilted reconstruction kernel is tilted at an angle relative to at least one of the phase encoding dimension and the PSF encoding dimension.

3. The method as recited in claim 2, wherein the tilted reconstruction kernel is tilted at a 45 degree angle relative to the PSF encoding dimension.

4. The method as recited in claim 1, wherein step (b) jointly synthesizes unsampled k-space points in both the phase encoding dimension and the PSF encoding dimension.

5. The method as recited in claim 1, wherein the tilted reconstruction kernel is structured to exploit correlations between the phase encoding dimension and the PSF encoding dimension.

6. The method as recited in claim 1, wherein the first data are acquired using a PSF echo planar imaging (EPI) pulse sequence that acquires multiple phase encodings for each of a plurality of different PSF encodings.

7. The method as recited in claim 6, wherein the PSF EPI pulse sequence includes a PSF-encoding loop that samples a point on the PSF encoding dimension at a plurality of different points on the phase encoding dimension.

8. The method as recited in claim 1, further comprising providing calibration data to the computer system and using the calibration data when synthesizing the unsampled k-space points.

9. The method as recited in claim 8, wherein the first data are acquired using a first pulse sequence having a first echo spacing, and the calibration data are acquired using a second pulse sequence having a second echo spacing that is the same as the first echo spacing.

10. The method as recited in claim 9, wherein the first pulse sequence and the second pulse sequence are both a PSF echo planar imaging (EPI) pulse sequence, and wherein the calibration data are acquired with a lower resolution than the first data.

11. The method as recited in claim 1, wherein the first data comprise k-space data in which alternating phase encoding lines are shifted relative to each other.

12. The method as recited in claim 11, wherein alternating phase encoding lines are shifted along the phase encoding dimension relative to each other.

13. The method as recited in claim 1, wherein synthesizing the unsampled k-space points includes using a GRAPPA algorithm that implements the tilted reconstruction kernel.

14. The method as recited in claim 1, wherein encoding the k-space data along the phase encoding dimension and the PSF encoding dimension both implement magnetic field gradients applied along a same spatial direction.

15. The method as recited in claim 1, wherein the image reconstructed in step (c) has reduced distortions and $T_2^*$ blurring relative to images reconstructed from the first data.

* * * * *

UNITED STATES PATENT AND TRADEMARK OFFICE
CERTIFICATE OF CORRECTION

PATENT NO. : 10,871,534 B2  
APPLICATION NO. : 16/429467  
DATED : December 22, 2020  
INVENTOR(S) : Kawin Setsompop et al.

Page 1 of 1

It is certified that error appears in the above-identified patent and that said Letters Patent is hereby corrected as shown below:

In the Specification

Column 2, Line 3, "$T_2$" should read --$T_2^*$--.

Column 3, Line 60, "T" should read --$T_2^*$--.

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*